United States Patent [19]

De Jager et al.

[11] Patent Number: 4,951,003
[45] Date of Patent: Aug. 21, 1990

[54] DIFFERENTIAL TRANSCONDUCTANCE CIRCUIT

[75] Inventors: Willem De Jager, Enschede; Evert Seevinck, Eindhoven, both of Netherlands

[73] Assignee: U.S. Philips Corp., New York, N.Y.

[21] Appl. No.: 352,421

[22] Filed: May 16, 1989

[30] Foreign Application Priority Data

Jun. 3, 1988 [NL] Netherlands ......................... 8801427

[51] Int. Cl.$^5$ .............................................. H03F 3/45
[52] U.S. Cl. ...................................... 330/252; 330/256
[58] Field of Search ............... 330/252, 256, 257, 259, 330/261, 289

[56] References Cited

U.S. PATENT DOCUMENTS

| Re. 32,479 | 8/1987 | Böhme | 330/252 X |
| 3,489,963 | 1/1970 | Gillett | 317/235 |
| 4,491,803 | 1/1985 | Metz et al. | 330/261 |
| 4,612,513 | 9/1986 | Seevinck | 330/261 |

FOREIGN PATENT DOCUMENTS 2039399 1/1973 Fed. Rep. of Germany ...... 330/252

OTHER PUBLICATIONS

D. A. Nelson, "Get the Most Out of a Versatile Video Amplifier", Electronic Design, vol. 29, No. 6, Mar. 19, 1981, pp. 227-231.

Primary Examiner—Steven Mottola
Attorney, Agent, or Firm—Emmanuel J. Lobato

[57] ABSTRACT

A amplifier circuit comprises first transistor ($T_1$) and a second transistor ($T_2$) whose emitters are each connected via a first resistors ($R_1$) to a point (2) which is connected to the power-supply terminal (3) by means of a current source (1). The bases of said transistors are connected to input terminals (4,5) and via a second resistor ($R_2$) each to the base of a third transistor ($T_3$) whose emitter is connected to the terminal (2). The linearity of the circuit is improved by arranging a fourth transistor ($T_4$) and a fifth transistor ($T_5$) in series with the collector-emitter paths of the first transistor ($T_1$) and the second transistor ($T_2$) which fourth and fifth transistor have their bases connected to a reference terminal (7) and have their emitters interconnected by means of a third resistor ($R_3$).

3 Claims, 1 Drawing Sheet

DIFFERENTIAL TRANSCONDUCTANCE CIRCUIT

BACKGROUND OF THE INVENTION

The invention relates to a transconductance circuit comprising a first and a second transistor of a first conductivity type having their bases coupled to input terminals for receiving an input signal and having their emitters connected to a common point by means of a first resistor, which common point is coupled to a first power-supply terminal by means of a current source, and a third transistor of the first conductivity type whose collector-emitter path is arranged between a second power-supply terminal and the common point and having its base coupled to a tap of a voltage divider comprising two substantially identical second resistors arranged between the bases of the first and the second transistor.

Such a circuit arrangement is generally suitable for use in integrated circuits and is particularly suitable for those uses where a comparatively large input voltage range is required.

Such an arrangement is known from European Patent Application 0,157,447 and corresponding U.S. Pat. No. 4,612,513. In the absence of an input voltage most of the current from the current source flows through the third transistor, so that only a small current will flow through the first resistors and the first and the second transistor. When the input voltage increases the current through the third transistor decreases and the current through either the first or second transistor increases until the entire current from the current source flows through this transistor. As a result of the small quiescent current through the first resistors and the first and the second transistor this circuit has a very low input offset voltage. Moreover, since the current through the first and the second transistor increases as the input voltage increases the circuit has a substantial slew rate.

However, a drawback of this circuit is that it exhibits a comparatively large non-linearity, which is caused by the fact that for low input voltages the transconductance of the circuit is substantially twice as high as that for high input voltages. Indeed, for low input voltages both the first and the second transistor contribute to the signal output current, whereas for high input voltages only one of the transistors contributes to this current.

SUMMARY OF THE INVENTION

Therefore, it is an object of the invention to improve the linearity of the known transconductance circuit. According to the invention a transconductance circuit of the type defined in the opening paragraph is characterized in that the circiut further comprises a fourth and a fifth transistor of the first conductivity type, having their collector-emitter paths arranged in series with the collector-emitter paths of the first and the second transistor, having their bases coupled to a reference-voltage terminal, and having their collectors coupled to the output terminals for supplying an output signal, and a third resistor arranged between the emitters of the fourth and the fifth transistor.

For low input voltages the currents through the first and the second transistor and hence those through the fourth and the fifth transistor are comparatively small. The base-emitter resistances of the fourth and the fifth transistor are then comparatively high. A part of the signal current through the first and the second transistor consequently flows through the third resistor, causing the output signal current and hence the transconductance of the circuit to be reduced. For high input voltages and consequently comparatively large collector currents the base-emitter resistances are comparatively low, so that almost the entire signal current flows into the collectors of the forth and the fifth transistor. As a result of this, comparatively high input voltages have hardly any influence on the transconductance of the circuit. The steps in accordance with the invention thus ensure that for low input voltages the transconductance is better in conformity with that for high input voltages, which improves the linearity of the circuit.

An embodiment of the circuit in accordance with the invention is characterized in that the circuit further comprises a sixth and a seventh transistor of a second conductivity type, having their collector-emitter paths arranged between the emitters of the first and the second transistor and the first power-supply terminal and having their bases coupled to the bases of the first and the second transistor. In the known circuit the input voltage range depends inter alia on the value of the current source, which dictates the maximum output current of the circuit. The current of this current source cannot be selected arbitrarily large because the quiescent current through the first resistors and the first and the second transistor and hence the input voltage offset will then increase. In the embodiment of the circuit in accordance with the invention the input voltage range is extended in that the sixth and the seventh transistor are turned on at high input voltages to supplement the current from the current source. In addition, the sixth and the seventh transistor protect the first and the second transistor against base-emitter breakdown owing to high negative base-emitter voltages.

BRIEF DESCRIPTION OF THE DRAWING

The invention will now be described in more detail, by way of example, with reference to the accompanying drawing, in which.

DETAILED DESCRIPTION OF THE INVENTION

Figure 1:
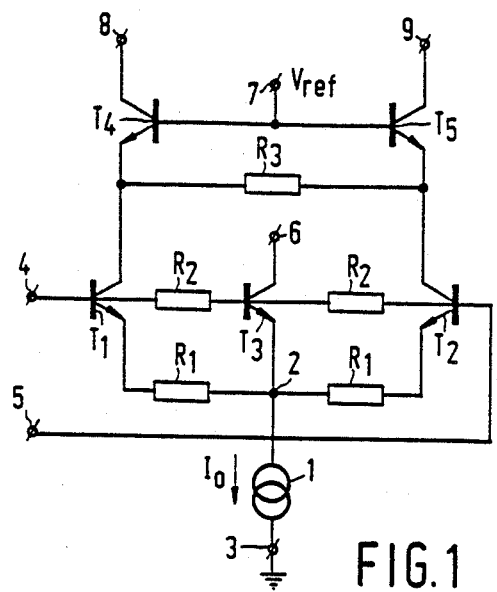
FIG. 1 shows the basic diagram of a transconductance circuit in accordance with the invention.

FIG. 1 shows the basic diagram of a transconductance circuit in accordance with the invention. The circuit comprises two NPN transistors $T_1$ and $T_2$ whose emitters are connected to a common point 2 via two substantially identical resistors $R_1$, which common point is connected to the negative power-supply terminal 3, in the present case ground, by means of a current source 1. The bases of the transistors $T_1$ and $T_2$ are connected to input terminals 4 and 5 for receiving an input voltage $V_i$. Moreover, a voltage divider comprising two substantially identical resistors $R_2$ is arranged between the bases of the transistors $T_1$ and $T_2$, the junction point between said resistors being connected to the base of an NPN transistor $T_3$. The collector-emitter path of this transistor is arranged between the positive power-supply terminal 6 and the common point 2.

The collector-emitter paths of two NPN transistors $T_4$ and $T_5$ are arranged in series with the collector emitter paths of the transistors $T_1$ and $T_2$. The bases of said transistors $T_4$ and $T_5$ are connected to a terminal 7 for a reference potential. A resistor $R_3$ is arranged between the emitters of the transistors $T_4$ and $T_5$. The collectors of these transistors are connected to output terminals 8 and 9 from which the output currents of the circuit can be taken. The terminals 8 and 9 may be interconnected, for example by means of a differential-to-single-ended converter, such as a current mirror. However, alternatively the terminals 8 and 9 may be connected to any other active or passive load.

When the transistors $T_4$ and $T_5$ and the resistor $R_3$ are ignored, the circuit operates as follows. In the quiescent state the bias current through the transistors $T_1$ and $T_2$ is much smaller than that through the transistor $T_3$ as a result of the feedback resistors $R^1$ so that most of the current $I_0$ from the current source 1 flows through the last-mentioned transistor. As a result of the small bias currents the circuit has a very low input offset voltage. As the input voltage increase the current through the transistor $T_3$ decreases gradually to zero, and the current through, for example, the transistor $T_1$ increases gradually until the entire current $I_0$ flows through this transistor.

The maximum signal current which can be delivered by the circuit is equal to the difference between the collector currents of the transistors $T_1$ and $T_2$. For high input voltages one of the transistors $T_1$ and $T_2$ is wholly or substantially cut off, so that only one of these transistors contributes to the output signal current. This current is inversely proportional to the sum of the resistance values of the resistors $R_1$. For low input voltages both transistors carry equal signal currents of opposite phase and of a magnitude which is also inversely proportional to the sum of the resistance values of the resistors $R_1$ if the base-emitter resistances of the transistors $T_1$ and $T_2$ are ignored. Consequently, the maximum output current is substantially inversely proportional to the resistance value of the resistor $R_1$. The transconductance of the circuit for low input voltages is therefore substantially twice as high as that for high input voltages. This input voltage which increases as the transconductance decreases leads to non-linearities of the output signal.

By means of the transistors $T_4$ and $T_5$ and the resistor $R_3$ the transconductance of the circuit for low input voltages is reduced, so that it more closely approximates to the transconductance for high input voltages. For low input voltages the base-emitter resistance of the transistors $T_1$ and $T_2$ will then be comparatively high because the bias currents are then small. Since the bias currents through the transistors $T_4$ and $T_5$ are equal these transistors also have comparatively high base-emitter resistances. If the value of the resistor $R_3$ is small relative to the value of said resistances a part of the signal current flowing in the collectors of the transistors $T_1$ and $T_2$ will flow through the resistor $R_3$. The signal currents in the collectors of the transistors $T_4$ and $T_5$ are consequently smaller than those in the collectors of the transistors $T_1$ and $T_2$. As a result of this the circuit will have a lower transconductance for small input voltages than the known circuit. For high input voltages the circuit is hardly influenced by the transistors $T_4$ and $T_5$ and the resistor $R_3$. For high input voltages the base-emitter resistances of the transistors $T_4$ and $T_5$ are low relative to the resistance value of the resistor $R_3$ because the bias currents flowing through these transistors are then larger. As a consequence, the signal current flowing in the collectors of the transistors $T_4$ and $T_5$ will be substantially equal to that in the collectors of the transistors $T_1$ and $T_2$.

For a specific current $I_0$ of the current source 1 the resistance value of the resistor $R_3$ for an optimum linearity of the circuit can be computed as follows. For high positive input voltages $V_{in}$ the collector signal current of the transistor $T_4$ complies with:

$$IcT4 \approx IcT1 = Vin/2R1 \qquad (1)$$

The transistor $T_2$ is then substantially cut off, so that:

$$IcT5 \approx IcT2 = 0 \qquad (2)$$

Obviously, the situation is reversed for high negative input voltages. Consequently, the difference between the two collector currents complies with:

$$IcT4 - IcT5 \approx Vin/2R1$$

For low input voltages both transistors $T_1$ and $T_2$ carry a signal current. The signal current in the collector of the transistor $T_1$ complies with:

$$icT1 = s \cdot VbeT1 = \frac{s \cdot Vin}{2(1 + s \cdot R1)} \qquad (3)$$

and that of the transistor $T_2$ complies with:

$$icT2 = sVbeT2 = \frac{-s \cdot Vin}{2(1 + s \cdot R1)} \qquad (4)$$

where s is the transconductance and Vbe is the base-emitter voltage of the relevant transistor. If for low input voltages the transconductance of the circuit must be equal to that for large input voltages this means that $$IcT4 = s.VbeT4 = Vin/4R1 \qquad (5)$$

and $$IcT5 = s.VbeT5 = Vin/4R1 \qquad (6)$$

Since the collector current of the transistor $T_1$ is equal to the sum of the collector current of the transistor $T_4$ and the current through the resistor $R_3$ this means that:

$$icT1 = \frac{s \cdot Vin}{2(1 + s \cdot R1)} + \frac{VbeT4 - VbeT5}{R_3} \qquad (7)$$

or $$\frac{s \cdot Vin}{2(1 + s \cdot R1)} = \frac{Vin}{4R1} + \frac{Vin}{2sR1 \cdot R3} \qquad (8)$$

It follows that for an optimum value of the resistor $R_3$ the following requirement must be met:

$$R3 = \left( \frac{s^2 R1}{1 + sR1} - \frac{s}{2} \right)^{-1} \qquad (9)$$

The transconductance $s = qI1/kT$, where $I_1$ is the quiescent current through the transistors $T_1$ and $T_2$, k is Boltzmann's constant, q is the elementary charge and T is the absolute temperature. The magnitude of the current $I_1$ can be derived simply from the voltage equation for the loop comprising the base-emitter junctions of the transistors $T_1$ and $T_3$ and the resistors $R_1$ and $R_2$ and from the equation for the sum of the current through the transistors $T_1$, $T_2$ and $T_3$, which is equal to the current $I_0$ of the current source 1.

Since the transconductance s is inversely proportional to the absolute temperature the current $I_1$ and hence the current $I_0$ of the current source I should preferably increase as a direct proportional function of the absolute temperature in order to achieve an optimum value of the resistance over a wide temperature range. Such PTAT current sources (PTAT=Proportional To Absolute Temperature) are generally known and require no further explanation. Such a current source is shown, for example, on page 283, FIG. 425 in the book "Analysis and Design of Analog Integrated Circuits", 1984.

Figure 2:
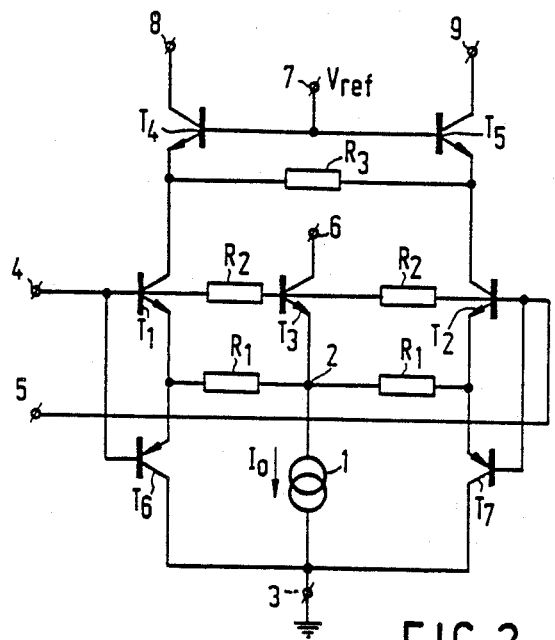
FIG. 2 shows an embodiment of a transconductance circuit in accordance with the invention.

In FIG. 2, which shows an embodiment of the circuit in accordance with the invention, identical parts bear the same reference numerals as in FIG. 1. In this circuit the emitters of the transistors $T_1$ and $T_2$ are connected to the negative power-supply terminal 3 by means of the collector-emitter paths of the PNP transistors $T_6$ and $T_7$. The base of the transistor $T_6$ is connected to the base of the transistor $T_1$ and the base of the transistor $T_7$ is connected to the base of the transistor $T_2$. In the circuit shown in FIG. 1 the effective input-voltage range is dictated by the current $I_0$ from the current source 1. This is because the current $I_0$ is the maximum output current of the circuit. The current $I_0$ cannot be selected too large because otherwise the input offset voltage will increase excessively. In the circuit shown in FIG. 2 the input-voltage range is extended in that for high input voltages the transistors $T_6$ and $T_7$ are turned on to increase the bias current of the circuit. In addition, the transistors $T_6$ and $T_7$ protect the transistors $T_1$ and $T_2$ against emitter base breakdown in the case of high voltages across the emitter base junctions of these transistors.

The invention is not limited to the embodiments shown herein. For example, the circuits shown may be equipped with transistors of opposite conductivity types. Moreover, the transistors may have either equal or unequal emitter areas.

In addition, it is possible to merely increase the input-voltage range of the circuit and to refrain from the linearity correction if the latter aspect is not important.

What is claimed is:

1. A transconductance circuit comprising
a first and a second transistor of a first conductivity type having their bases coupled to input terminals for receiving an input signal and having their emitters connected to a common point by means of first resistors, which common point is coupled to a first power-supply terminal by means of a current source,
a third transistor of the first conductivity type whose collector-emitter path is arranged between a second power-supply terminal and the common point and having its base coupled to a tap of a voltage divider comprising two substantially identical second resistors arranged between the bases of the first and the second transistor,
a fourth and a fifth transistor of the first conductivity type, having their collector-emitter paths arranged in series with the collector-emitter paths of the first and the second transistor respectively, having their bases coupled to a reference-voltage terminal, and having their collectors coupled to the output terminals for supplying an output signal, and
a third resistor arranged between the emitters of the fourth and the fifth transistor.

2. A transconductance circuit as claimed in claim 1, further comprising a sixth and a seventh transistor of a second conductivity type, having their collector-emitter paths arranged between the respective emitters of the first and the second transistor and the first power-supply terminal, and having their bases coupled to the respective bases of the first and the second transistor.

3. A transconductance circuit as claimed in claim 1, wherein the current source is adapted to supply a current with a positive temperature coefficient.

* * * * *